United States Patent
Son et al.

(10) Patent No.: US 8,937,831 B2
(45) Date of Patent: Jan. 20, 2015

(54) SYSTEM AND METHOD FOR MODIFYING ACTIVATION OF A SENSE AMPLIFIER

(71) Applicant: Marvell World Trade Ltd., St. Michael (BB)

(72) Inventors: Moon-Hae Son, San Jose, CA (US); Peter Lee, Pleasanton, CA (US); Winston Lee, Palo Alto, CA (US)

(73) Assignee: Marvell World Trade Ltd. (BB)

( * ) Notice: Subject to any disclaimer, the term of this patent is extended or adjusted under 35 U.S.C. 154(b) by 26 days.

(21) Appl. No.: 13/740,406

(22) Filed: Jan. 14, 2013

(65) Prior Publication Data

US 2013/0182491 A1 Jul. 18, 2013

Related U.S. Application Data

(60) Provisional application No. 61/587,429, filed on Jan. 17, 2012.

(51) Int. Cl.
*G11C 11/00* (2006.01)
*G11C 7/06* (2006.01)
*G11C 7/08* (2006.01)
*G11C 7/22* (2006.01)
*G11C 11/419* (2006.01)

(52) U.S. Cl.
CPC .. *G11C 7/06* (2013.01); *G11C 7/08* (2013.01); *G11C 7/227* (2013.01); *G11C 11/419* (2013.01)
USPC .......................................................... 365/154

(58) Field of Classification Search
CPC ............. G11C 7/06; G11C 7/227; G11C 7/08
USPC ........................................................ 365/154
See application file for complete search history.

(56) References Cited

U.S. PATENT DOCUMENTS

| 6,282,133 | B1 * | 8/2001 | Nakagawa et al. ............ 365/194 |
| 7,701,792 | B2 | 4/2010 | Oh |
| 7,995,413 | B2 * | 8/2011 | Genevaux et al. ........ 365/210.11 |
| 2007/0280022 | A1 * | 12/2007 | Nguyen et al. ................ 365/210 |

OTHER PUBLICATIONS

Patent Cooperation Treaty (PCT) International Search Report and Written Opinion issued in PCT International Application No. PCT/IB2013000366 (International Filing Date Jan. 14, 2013), having a Date of Mailing of May 28, 2013 (11 pgs).
Suzuki et al., 4.1 Programmable and Automatically-Adjusting Sense-Amplifier Activation Scheme and Multi-Reset Address-Driven Decoding Scheme for High-Speed Reusable SRAM Core, IEEE 2002 Symposium on VLSI Circuits Digest of Technical Papers, 2002 (pp. 44-45).

* cited by examiner

*Primary Examiner* — Anthan Tran (57) ABSTRACT

Systems, methods, and other embodiments associated with controlling a sense amplifier in a memory device are described. According to one embodiment, an apparatus includes a signal generator configured to generate a sense enable signal that activates a sense amplifier of a memory cell in a memory device. The apparatus includes a dummy memory cell connected to a current mirror circuit that is configured to detect a timing variation in the dummy memory cell from a predefined timing and to alter a timing of the sense enable signal based, at least in part, on the timing variation. The apparatus also includes a controller configured to modify the timing of the sense enable signal by selectively enabling one or more of a plurality of semiconductor gates in the current mirror circuit. The plurality of semiconductor gates are connected in parallel.

19 Claims, 8 Drawing Sheets

SYSTEM AND METHOD FOR MODIFYING ACTIVATION OF A SENSE AMPLIFIER

CROSS REFERENCE TO RELATED APPLICATIONS

This patent disclosure claims the benefit of U.S. provisional application Ser. No. 61/587,429 filed on Jan. 17, 2012, which is hereby wholly incorporated by reference.

BACKGROUND

The background description provided herein is for the purpose of generally presenting the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

A sense amplifier is an element in a computer memory that senses a voltage stored in a memory cell. The sense amplifier determines a data value of the memory cell by determining the voltage from the memory cell and then amplifying the voltage to an operational voltage that can be used in a logic circuit (e.g., a host computer) to represent the data value. In this way, the sense amplifier provides a bit value stored in the memory cell to the logic circuit at a voltage level at which the logic circuit operates.

However, variations between memory cells can cause differences between how quickly the memory cells provide the voltage on a bit line to the sense amplifier. These variations result in difficulties when configuring a sense enable signal that activates the sense amplifier. For example, if a memory cell does not provide a stored voltage to the sense amplifier before the sense amplifier is activated, then the sense amplifier can experience difficulties in sensing the voltage. Additionally, if the sense enable signal is delayed by a large margin to account for slow memory cells, then the memory device experiences access latency difficulties.

SUMMARY

In general, in one aspect this specification discloses an apparatus. The apparatus includes a signal generator configured to generate a sense enable signal that activates a sense amplifier of a memory cell in a memory device. The apparatus includes a dummy memory cell connected to a current mirror circuit that is configured to detect a timing variation in the dummy memory cell from a predefined timing and to alter a timing of the sense enable signal based, at least in part, on the timing variation. The apparatus also includes a controller configured to modify the timing of the sense enable signal by selectively enabling one or more of a plurality of semiconductor gates in the current mirror circuit. The plurality of semiconductor gates are connected in parallel.

In another embodiment, the memory device is a static random access memory (SRAM) and the apparatus is integrated with the SRAM.

In another embodiment, the controller is configured to modify the timing of the sense enable signal to advance when the sense enable signal occurs.

In another embodiment, the controller is configured to advance when the sense enable signal occurs by an amount based on a number of the plurality of semiconductor gates that the controller enables. Each semiconductor gate enabled by the controller advances the timing of the sense enable signal by a predetermined amount.

In another embodiment, the timing variation is a difference between when the dummy memory cell produces that satisfies a threshold voltage for reading from the dummy memory cell and the predefined timing of when the dummy memory cell is expected to produce the voltage.

In another embodiment, the threshold voltage is a minimum voltage for activating a logic gate.

In another embodiment, the dummy memory cell includes a bit line connected to a voltage source.

In general, in another aspect, this specification discloses a method. The method includes detecting a timing variation from a predefined timing in a dummy memory cell. The method includes adjusting a timing of a sense enable signal based, at least in part, on the timing variation. The method includes selectively enabling one or more parallel semiconductor gates to modify the timing of the sense enable signal. The method also includes generating, in a signal generator, the sense enable signal based, at least in part, on the timing. The sense enable signal activates a sense amplifier in a memory device.

In another embodiment, enabling the one or more parallel semiconductor gates advances when the signal generator generates the sense enable signal.

In another embodiment, enabling the one or more parallel semiconductor gates advances when the sense enable signal activates the sense amplifier by an amount based on a number of the plurality of parallel semiconductor gates that are enabled by a control signal from a controller.

In another embodiment, for each of the plurality of semiconductor gates that are enabled the timing of the sense enable signal is advanced by a predetermined amount.

In another embodiment, the timing variation is a difference between when the dummy memory cell produces a voltage that satisfies a threshold voltage for reading from the dummy memory cell and the predefined timing of when the dummy memory cell is expected to produce the voltage.

In another embodiment, the threshold voltage is a minimum voltage for activating a logic gate.

In another embodiment, generating the sense enable signal causes the sense amplifier to read a value from the memory cell.

In another embodiment, detecting the timing variation in a dummy memory cell includes reading a bit line of the dummy memory cell that is hardwired to a voltage source.

In general, in one aspect this specification discloses an integrated circuit. The integrated circuit includes a signal generator configured to produce a sense enable signal that activates a sense amplifier. The integrated circuit includes a dummy memory cell connected to a current mirror circuit. The current mirror circuit is configured to detect a timing variation in the dummy memory cell from a predefined timing and to alter a timing of the sense enable signal based, at least in part, on the timing variation.

In another embodiment, the integrated circuit includes a controller configured to modify the timing of the sense enable signal by selectively enabling one or more of a plurality of semiconductor gates in the current mirror circuit that are connected in parallel.

In another embodiment, the current mirror circuit includes a plurality of semiconductor gates connected in parallel and configured to change a rate at which voltage is provided by the dummy memory cell based on a number of the semiconductor gates that are enabled.

In another embodiment, the sense enable circuit is configured to activate the sense amplifier to read data from a memory cell in a memory device.

In another embodiment, the integrated circuit is a static random access memory (SRAM).

BRIEF DESCRIPTION OF THE DRAWINGS

The accompanying drawings, which are incorporated in and constitute a part of the specification, illustrate various systems, methods, and other embodiments of the disclosure. Illustrated element boundaries (e.g., boxes, groups of boxes, or other shapes) in the figures represent one example of the boundaries. In some examples, one element may be designed as multiple elements or multiple elements may be designed as one element. In some examples, an element shown as an internal component of another element may be implemented as an external component and vice versa.

DETAILED DESCRIPTION

Described herein are examples of systems, methods, and other embodiments associated with controlling when a sense amplifier in a memory device is enabled. As stated previously, the sense amplifier is an element in the memory device that senses a logic level (i.e., stored data) of a memory cell. The sense amplifier determines the logic level stored in the memory cell by determining a value of a voltage provided by the memory cell on a bit line. Different voltage values (e.g., 0 mV or 1 mV) denote different data values (e.g., 0 or 1). After the voltage value is determined, the sense amplifier amplifies the voltage (e.g., 1 mV) to an operational voltage (e.g., 5 mV) for use by a computing device.

However, timing of when the sense amplifier is activated to read the voltage can influence performance of the memory device in several ways. For example, if the sense amplifier is activated before the memory cell provides the voltage on the bit line or the bit line has not yet reached a threshold voltage necessary to detect the logic level then the sense amplifier may experience difficulties determining the stored data. Additionally, a rate at which the bit line reaches a threshold value for detection may vary depending on, for example, manufacturing variations in memory cells of the memory device.

To resolve difficulties about when to generate a sense enable signal, a timing margin is added to the sense enable signal. The timing margin delays when the sense enable signal is generated and thereby also when the sense amplifier is activated. However, selecting one timing margin that is applied to many different memory cells results in using a timing margin for a worst case scenario, which then contributes to delayed access times in the memory device.

Accordingly, in one embodiment, a circuit that generates the sense enable signal includes a dummy memory cell. Because the cells are manufactured together as part of one memory device, the dummy memory cell includes variations that correlate with actual memory cells in the memory device. Thus, the dummy memory cell is used to sample the variation so that the sense enable signal can be adjusted. In this way, the sensing margin is based on an actual variation in timing from the dummy memory cell and not a predicted timing variation, which can erroneously inflate the sensing margin by accounting for a worst case scenario.

As will be described below, in another embodiment, the sensing margin is controlled by a set of parallel semiconductor gates in the memory device. The set of parallel semiconductor gates can be individually enabled or disabled to incrementally modify the sensing margin. In this way, generating the sense enable signal is controlled to use an improved sensing margin that improves memory access times.

Figure 1:
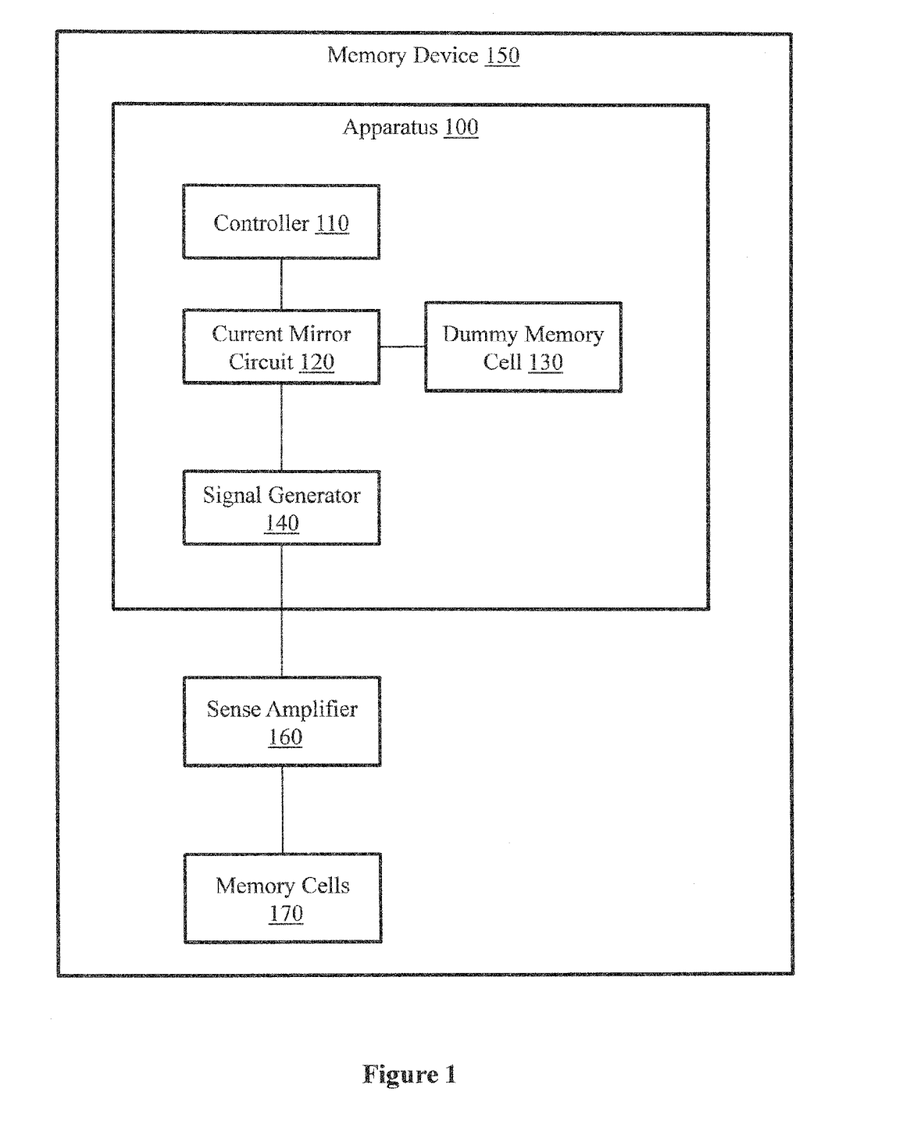
FIG. 1 illustrates one embodiment of an apparatus associated with controlling when a sense amplifier is enabled in a memory device.

With reference to FIG. 1, one embodiment of an apparatus 100 associated with enabling a sense amplifier is illustrated. The apparatus 100 includes a controller 110, a current mirror circuit 120, a dummy memory cell 130, and a signal generator 140. The apparatus 100 is, for example, integrated into a memory device 150 that includes a sense amplifier 160 that senses data stored in memory cells 170. In one embodiment, the memory device 150 is a static random access memory (SRAM) or other memory device that stores data. The apparatus 100 is configured to control when the sense amplifier 160 in the memory device 150 is enabled to read data from the memory cells 170. By controlling when the sense amplifier 160 is enabled, data can be read from the memory cells 170 using a sensing margin that improves a time to access data in the memory cells 170.

The apparatus 100 activates the sense amplifier 160 by using a sense enable signal generated by the signal generator 140. However, several elements in the apparatus 100 influence when the signal generator 140 generates the sense enable signal. For example, the apparatus 100 is initiated when the memory device 150 receives a read signal for data to be read from one or more of the memory cells 170.

The read signal activates an internal bit line of the dummy memory cell 130. Typically, the internal bit line carries a voltage stored by internal components of the dummy memory cell 130. However, in the dummy memory cell 130, a value of the voltage on the bit line is not valid data, instead the value is a sample of how the bit line changes values when activated. The dummy memory cell 130 is configured with an inverse bit line that is hardwired to a voltage source (not shown). In this way, the dummy memory cell 130 provides a value that is the same whenever activated. However, because the value is known, a rate at which the value changes is available to adjust timing of the sense enable signal. That is, the apparatus 100 uses the dummy memory cell 130 to sample timing variation that exists in the dummy memory cell 130, which mirrors variation in the memory cells 170. Accordingly, the dummy memory cell 130 contributes a sample of timing variation present in the memory cells 170 and not an actual data value for use by a computing device.

Figure 2:
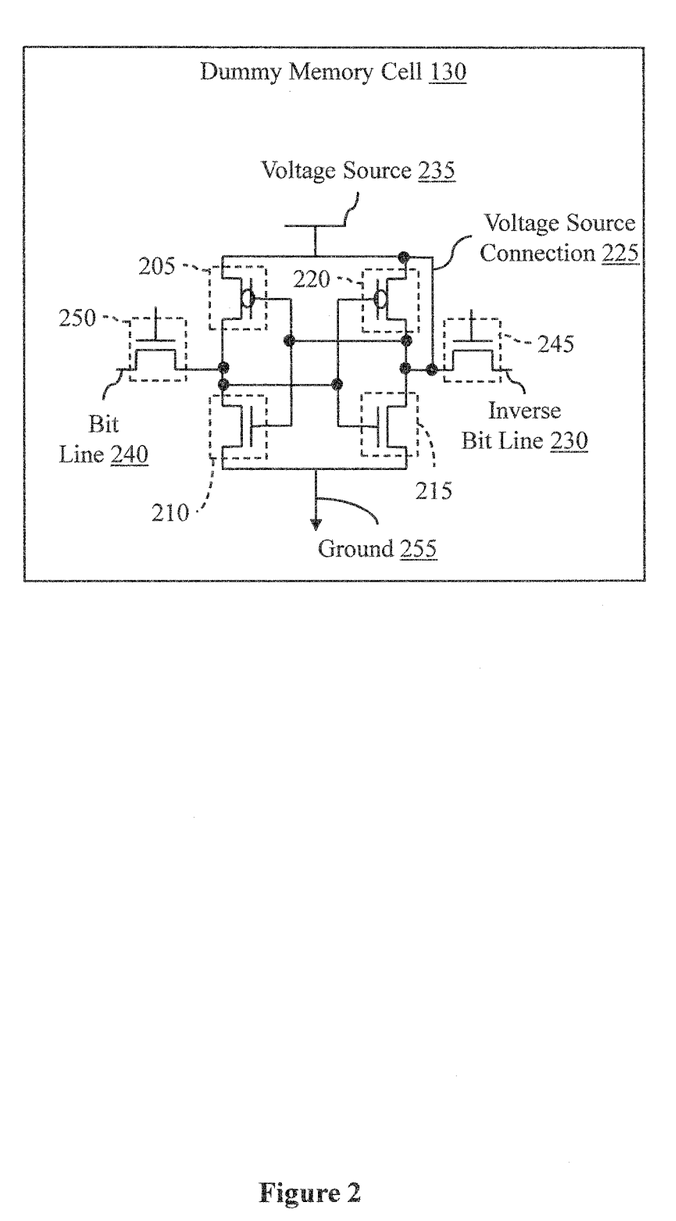
FIG. 2 illustrates one embodiment of a dummy memory cell associated with controlling when a sense amplifier is enabled in a memory device.

Consider FIG. 2, which illustrates one embodiment of the dummy memory cell 130. In FIG. 2, the dummy memory cell 130 is illustrated with semiconductor gates 205, 210, 215, and 220 that would typically store data. Semiconductor gates 205 and 220 are P-type metal oxide semiconductor (pmos) gates and semiconductor gates 210 and 215 are N-type metal oxide semiconductor (nmos) gates. The dummy memory cell 130 is configured with a voltage source connection 225 that connects an inverse bit line 230 with a voltage source 235. The voltage source 235 provides a voltage (e.g., 1 mV) for a "high" (e.g., 1) logic value. Consequently, connecting the inverse bit line 230 to the voltage source 235 causes the dummy memory cell 130 to provide a value of zero Volts on a bit line 240 whenever activated.

By connecting the inverse bit line 230 directly to the voltage source 235, the dummy memory cell 130 provides the same value each time the dummy memory cell 130 is activated on the bit line 240 and the inverse bit line 230 (opposite value of the bit line 240). Because the value provided by the dummy cell 130 is known, a rate at which the bit line 240 reaches the value can be used to contribute to the timing of the sense enable signal. That is, the rate at which the bit line reaches a threshold voltage is used to modify the timing of when the sense enable signal is generated.

For example, when the dummy memory cell 130 is activated, the bit line 240 does not immediately provide the voltage. The bit line 240 gradually changes (e.g., from 1 mV to 0 mV) at a rate that is particular to the dummy memory cell 130 and the memory cells 170. The rate reflects the variation in the dummy memory cell 130 and also in the memory cells 170. The variation can be due to varying levels of voltage leaks across different semiconductor gates in the dummy memory cell 130 or other defects that result as part of the manufacturing process. Accordingly, depending on the variation, the bit line 240 reaches the voltage at the rate, which is unknown prior to operating the memory device 150. Thus, when the voltage activates the signal generator 140 to generate the sense enable signal is based on the rate.

To further explain the dummy memory cell 130 and with continued reference to FIG. 2, activating the dummy memory cell 130 occurs when semiconductor gates 245 and 250 are enabled. In a memory cell where the voltage source connection 225 is not present, activating the semiconductor gates 245 and 250 causes the memory cell to apply a stored voltage on the bit line 240 and the inverse bit line 230. But, because the voltage source connection 225 by-passes the semi-conductor gate 220, the bit line 240 is automatically pulled to ground 250 (i.e., 0 Volts). Additionally, even if a stored voltage is present it will not be provided on the bit line 240 because of the voltage source connection 225. The voltage source connection 225 causes the semi-conductor gate 210 to be activated and in turn for the bit line 240 to be connected to the ground 255.

While the voltage source connection 225 causes the bit line 240 to provide a value of zero Volts, the voltage source connection 225 causes the inverse bit line 230 to provide a value that is equivalent to a logic value of "1" (e.g., 1 mV). In other embodiments, the dummy memory cell 130 is configured with a ground source connection (not illustrated) that causes values of the bit line 240 and the inverse bit line 230 to be opposite of when the dummy memory cell 130 is configured with the voltage source connection 225. Accordingly, values from the bit line 240 and the inverse bit line 230 are arbitrary, but the rate at which the values are provided is used to time the sense enable signal.

Referring back to FIG. 1, the dummy memory cell 130 is connected to the signal generator 140 through the current mirror circuit 120. Accordingly, the current mirror circuit 120 provides a signal to the signal generator 140 based on the value from the bit line 240 of the dummy memory cell 130. However, the current mirror circuit 120 is configured to modify the rate at which the dummy memory cell 130 provides the voltage on the bit line 240 and thereby also change when the signal generator 140 generates the sense enable signal.

The current mirror circuit 120 includes a plurality of semiconductor gates that are arranged in parallel between a voltage source and a ground. Additionally, each of the plurality of semiconductor gates are configured to be separately enabled or disabled and are separately controlled by the controller 110. With each semiconductor gate of the plurality of semiconductor gates that is enabled, the rate at which the voltage is provided by the dummy memory cell 130 increases. Therefore, the current mirror circuit 120 advances the timing of the sense enable signal using the plurality of semiconductor gates. In this way, the controller 110 activates one, two, or more of the semiconductor gates to change the timing of the sense enable signal. Accordingly, the rate at which the voltage changes is modifiable in order to precisely tune when the sense enable signal activates the sense amplifier 160.

Figure 3:
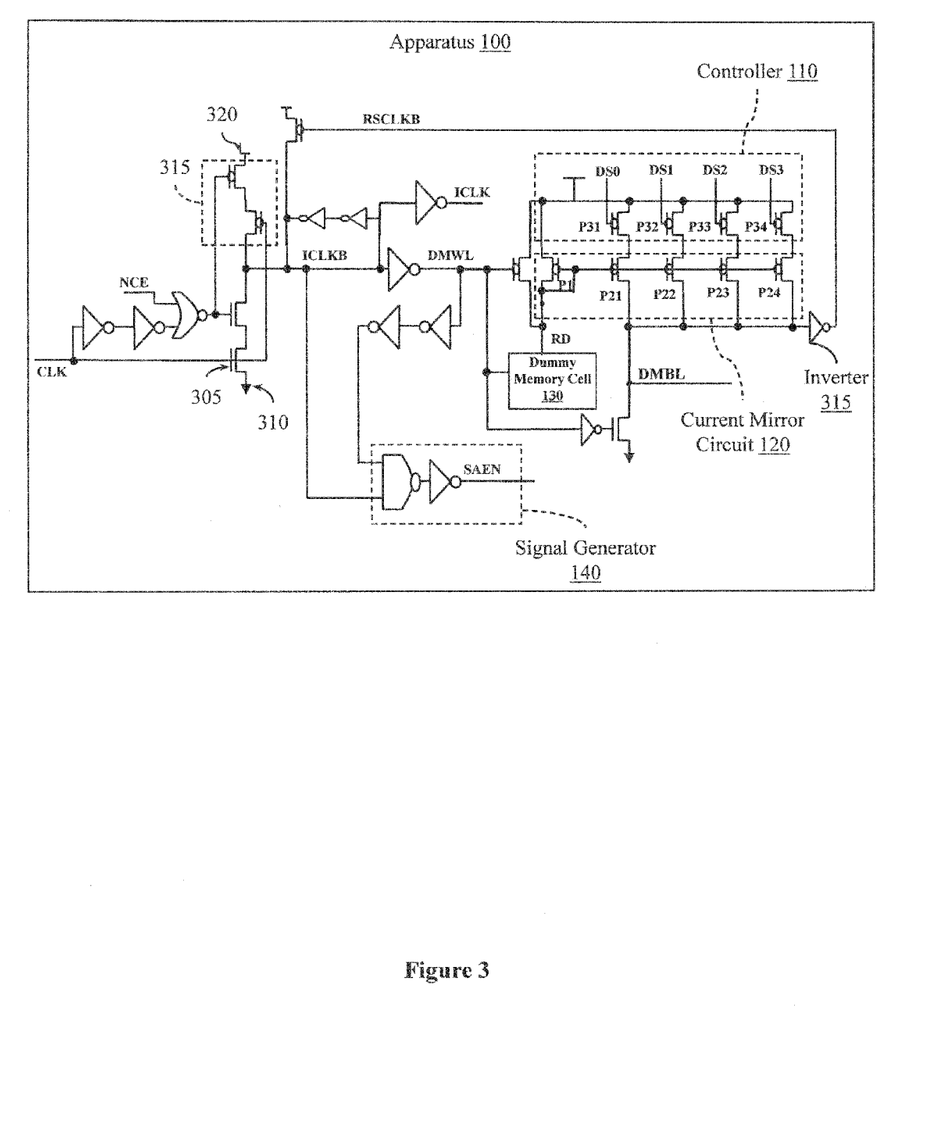
FIG. 3 illustrates one embodiment of an apparatus associated with controlling when a sense amplifier is enabled in a memory device.
Figure 4:
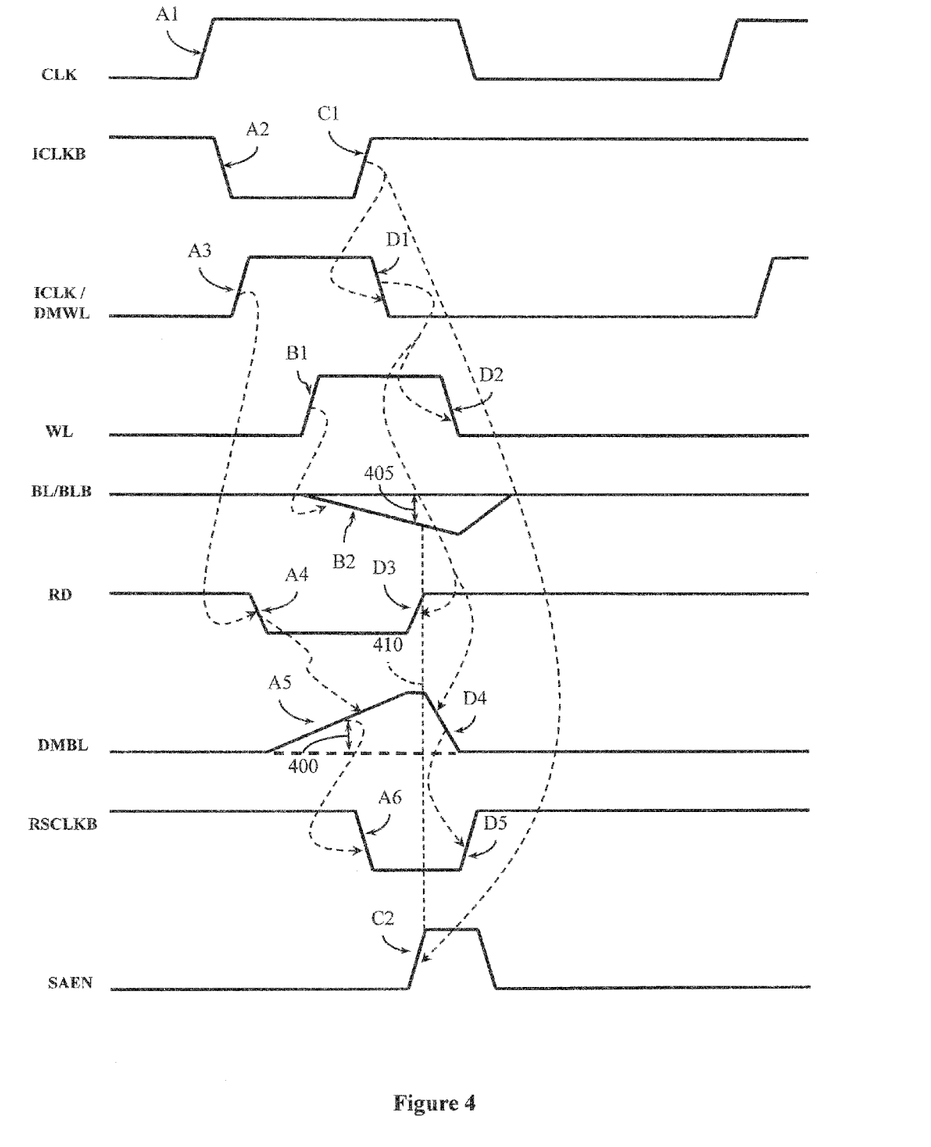
FIG. 4 illustrates a timing diagram for the apparatus illustrated in FIG. 3.

Controlling when the sense enable signal is generated will be discussed in greater detail with reference to FIG. 3. FIG. 3 illustrates another embodiment of the apparatus 100 from FIG. 1. FIG. 3 will be discussed simultaneously with FIG. 4. FIG. 4 illustrates a timing diagram of signals in the apparatus 100, as illustrated in FIG. 3. In general, labels illustrated on lines in FIG. 3 indicate abbreviated names of signals on those lines and also generally correspond to labels in FIG. 4.

A clock signal (CLK), as illustrated in FIG. 4, initiates the apparatus 100 at A1. When the clock signal (CLK) goes high at A1, and the chip enable signal (NCE) is low (not shown in FIG. 4), a secondary clock signal (ICLKB) is driven low by gate 305 through a connection to ground 310. Prior to gate 305 opening and when the apparatus 100 is not in use, the secondary clock signal is held high by gates 315 and current source 320. Accordingly, upon the secondary clock signal (ICLKB) changing to low at A2, a cascade of signals occurs in the apparatus 100.

The cascade of signals begins when a dummy word line (DMWL) signal changes to high at A3. The DMWL signal changing at A3 causes the dummy memory cell 130 to be activated. In turn at A4, the dummy memory cell 130 activates the current mirror circuit 120 via a read signal (RD). Next at A5, the current mirror circuit 120 causes a dummy bit line (e.g., the bit line 240) to produce a dummy bit line signal (DMBL). A slope of the DMBL signal is representative of a rate at which the dummy memory cell 130 provides the DMBL signal (i.e., a voltage on the bit line 240). The current mirror circuit 120 is configured to modify the rate depending on whether the controller 110 has enabled any of parallel semiconductor gates P21, P22, P23, P24 in the current mirror circuit 120. The RD signal, via P1, permits activation of the semiconductor gates P21, P22, P23, P24, however, control lines DS0, DS1, DS2, and/or DS3 also must be activated by the controller 110 for control gates P31, P32, P33, and/or P34 to enable the semiconductor gates P21, P22, P23, and/or P24. Further details of the DMBL signal and the current mirror circuit 120 will be discussed with reference to FIG. 5.

With continued reference to FIGS. 3 and 4, once the DMBL signal reaches a threshold voltage 400 for activating an inverter 315, a reset clock bar (RSCLKB) signal goes low at A6. Activating the inverter 315 at A6 occurs based on when the DMBL signal achieves the threshold voltage 400. When the threshold voltage 400 is achieved, occurs based on the rate of change of the DMBL signal (i.e., a slope of the DMBL signal). The rate occurs as a function of timing variation in the dummy memory cell 130 and how many of the gates P21, P22, P23, and P24 in the current mirror circuit 120 that have been activated.

Additionally, the change at A6 in the RSCLKB signal/line causes the ICLKB signal/line to return to a high value at C1. With the ICLKB signal high at C1 and the DMWL signal still high from the transition at A3, the sense enable signal (SAEN) is finally triggered at C2. Accordingly, the signal generator 140 generates the SAEN signal for a brief period while both the ICKLB signal and the DMWL signal are high, thereby enabling the sense amplifier 170 from FIG. 1. However, with the transition at C1, a cascade of events begins to occur to shutdown the apparatus 100. The shutdown events begin with D1, and progresses to D2, D3, D4, and D5 which disables the SAEN signal after it has been produced.

With continued reference to FIG. 4, notice that two additional signals are shown (i.e., WL and BL/BLB) that are not present in the apparatus 100, as illustrated in FIG. 3. The two signals, a word line (WL) signal and a bit line/bit line bar (BL/BLB) signal, are signals present in the memory cells 170 of FIG. 1. At B1, the WL signal activates a word line of a memory cell that is to be read. The BL/BLB (i.e., bit line/bit line bar) signal is an actual data value from a memory cell as the value is read onto a bit line at B2. A threshold voltage 405 indicates a point where a voltage of the BL/BLB signal has reached a level that can be sensed by the sense amplifier 160 of FIG. 1. Dashed line 410 illustrates when the sense amplifier 160 of FIG. 1 is enabled by the apparatus 100 in comparison to when the voltage from the BL/BLB signal from the memory cell reaches the threshold voltage 405. A difference in time between when the threshold voltage 405 is achieved, and when the SAEN signal is generated at C2 demonstrates an improved sensing margin for reading from the memory cells 170.

Figure 5:
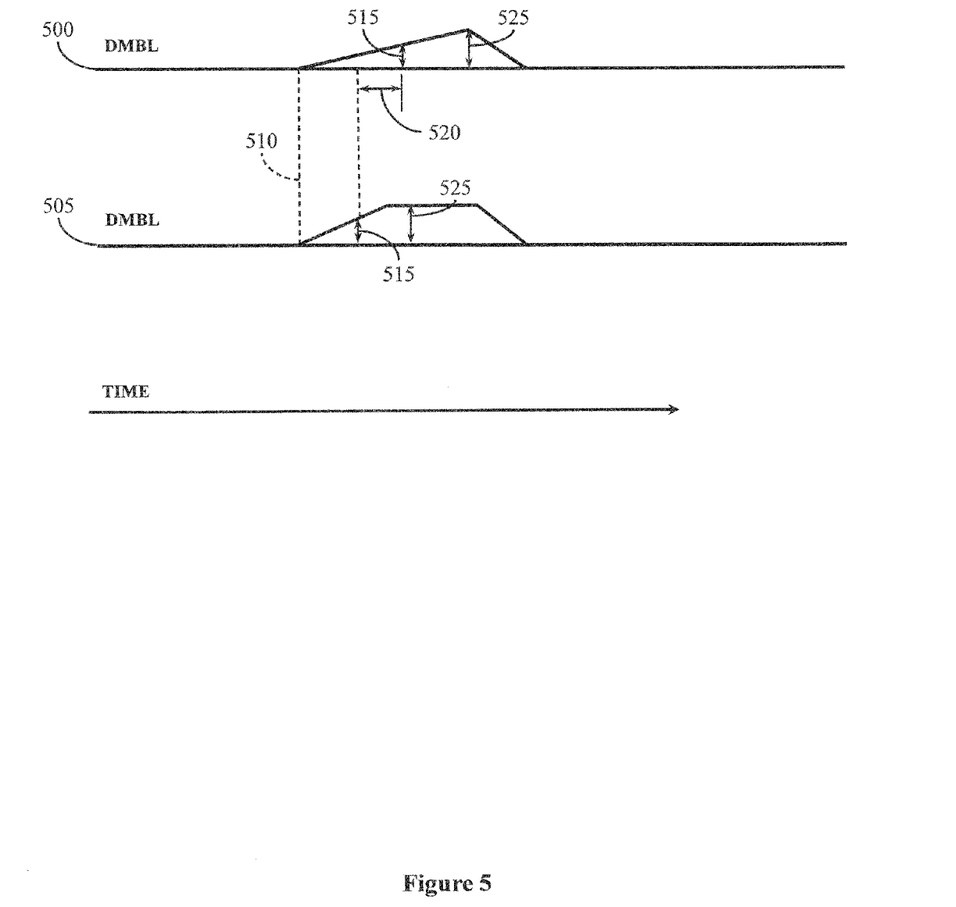
FIG. 5 illustrates a timing diagram of two example dummy bit line signals from a dummy memory cell.

Now, consider FIG. 5, which illustrates two examples of the DMBL signal from FIG. 4. In FIG. 5, a first DMBL signal 500 is unmodified by the current mirror circuit 120 and a second DMBL signal 505 is modified by the current mirror circuit 120 to advance when the sense enable signal is generated. The first DMBL signal 500 illustrates a signal produced by the dummy memory cell 130. Both the first and the second DMBL signals are initiated at time 510. However, the second DMBL signal 505 attains a threshold voltage 515 before the first DMBL signal 500, as illustrated by a gap 520 in timing. A final voltage 525 is also illustrated for comparison purposes. The gap 520 illustrates how the current mirror circuit 120 can modify the rate of change of the DMBL signal 505 in order to advance when the sense enable signal is generated. Additionally, even though only two signals (i.e., 500 and 505) are illustrated, the current mirror circuit 120 is configured to modify the DMBL signal by more or less than what is shown in the DMBL signal 505. That is, depending on how many of the plurality of parallel semiconductor gates in the current mirror circuit 120 that are enabled, a slope (i.e., rate of change) of the first DMBL signal 505 can be modified to precisely control when the threshold voltage 515 is achieved.

Figure 6:
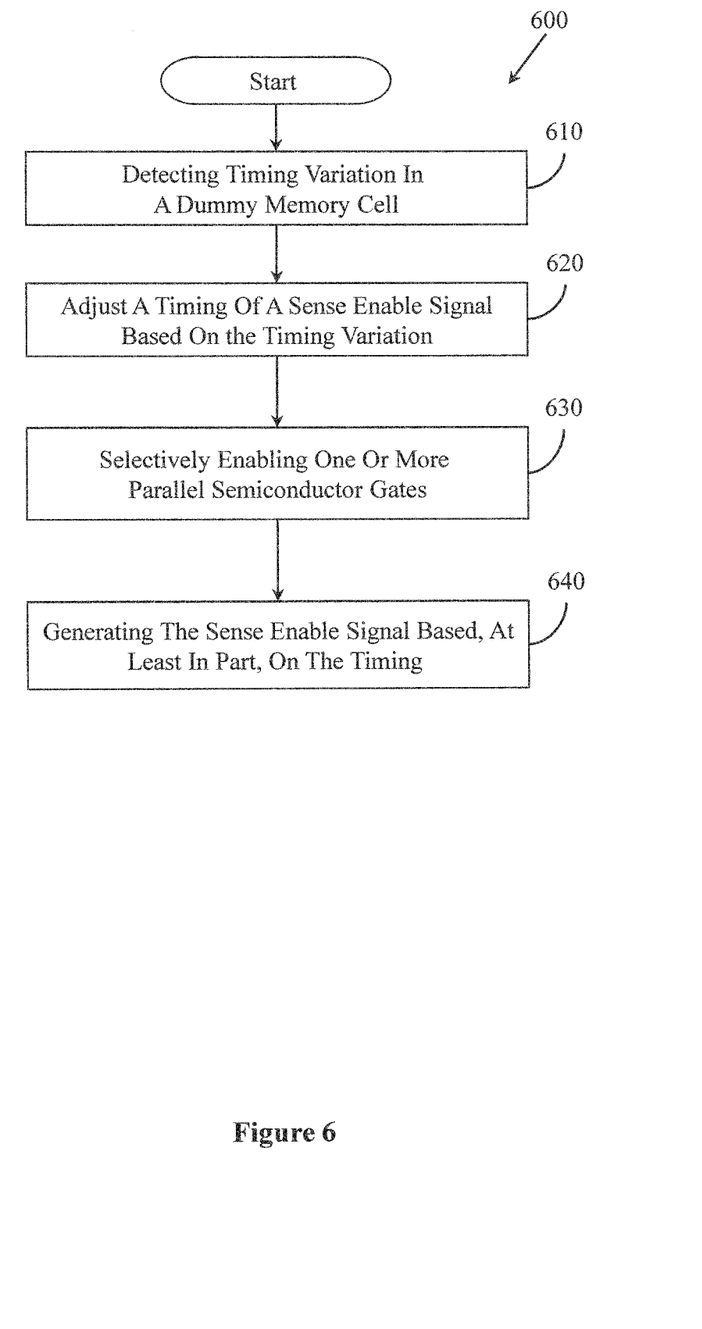
FIG. 6 illustrates one embodiment of a method associated with controlling when a sense amplifier is enabled in a memory device.

Further details of controlling when a sense amplifier in a memory device is enabled will be discussed with reference to FIG. 6. FIG. 6 illustrates a method 600 associated with modifying timing of a sense enable signal to control when a sense amplifier is enabled. Method 600 will be discussed from the perspective of the apparatus 100 of FIG. 1.

At 610, the apparatus 100 detects timing variation in a dummy memory cell (e.g., dummy memory cell 130). In one embodiment, the timing variation of the dummy memory cell correlates to timing variation of memory cells from which data is to be read. Thus, the timing variation from the dummy memory cell is used to adjust the timing of the sense enable signal by configuring the dummy memory cell within a circuit path for generating the sense enable signal.

In general, the timing variation is a difference between when the dummy memory cell produces a voltage that satisfies a threshold voltage and a predefined timing of when the dummy memory cell is expected to produce the voltage. The variation is a result of manufacturing variations and other defects in the dummy memory cell (e.g., voltage leaks).

Thus, detecting the timing variation in the dummy memory cell can include reading a bit line of the dummy memory cell. Because an inverse bit line of the dummy memory cell is hardwired to a voltage source, the dummy memory cell does not store a value but instead provides the same value on the bit line whenever activated. The value is provided on the bit line at a rate that is specific to the dummy memory cell (i.e., timing variation of the dummy memory cell). Therefore, by wiring the bit line into the circuit path and using a voltage provided on the bit line to activate a logic gate, the timing variation of the dummy memory cell is applied to the circuit path for generating the sense enable signal. Accordingly, when the sense enable signal is generated is based on timing of when the bit line from the dummy memory cell achieves a threshold voltage for activating the logic gate.

For example, if more timing variation is present in the dummy memory cell, then the dummy memory cell takes longer to produce the voltage on the bit line that satisfies the threshold voltage. When the variation is greater timing of when the sense enable signal is generated will be delayed since the bit line will take longer to reach the threshold voltage.

The threshold voltage is a minimum voltage for activating a logic gate that is used in generating the sense enable signal. Consequently, at 620, the apparatus 100 adjusts the timing of the sense enable signal based, at least in part, on the timing variation. In one embodiment, adjusting the timing includes providing the signal from the dummy memory cell 130 as it is read out to the logic gate. In general, the dummy memory cell automatically modifies the timing since the timing depends on when the logic gate is activated by a voltage on the bit line from the dummy memory cell.

At 630, the apparatus 100 selectively enables one or more parallel semiconductor gates. In one embodiment, the semiconductor gates are part of a current mirror circuit (e.g., the current mirror circuit 120 of FIG. 1). The current mirror circuit receives a signal from the bit line of the dummy memory cell. Thus, enabling one or more of the semiconductor gates in the current mirror circuit modifies the rate at which the signal occurs on the bit line. In this way, the current mirror circuit can modify the timing variation of the dummy memory cell in order to modify when the sense enable signal occurs.

For example, modifying the timing at 630 can advance when the sense amplifier is activated. Additionally, for each of the semiconductor gates that are enabled, the timing of the sense enable signal is modified by an additional amount. The amount is a predetermined amount of time that is based on how much each of the semiconductor gates contributes to changing the voltage on the bit line of the dummy memory cell.

At 640, the apparatus 100 generates the sense enable signal. The sense enable signal is generated based, at least in part, on the timing as modified by the semiconductor gates at 630 and by the dummy memory cell at 620. The sense enable signal activates a sense amplifier (e.g., the sense amplifier 160) to read a value from a memory cell (e.g., one of the memory cells 170). By modifying the timing of the sense enable signal, delay from a sensing margin is improved by dynamically determining the timing variation in and not using a pre-programmed value for the sensing margin.

Figure 7:
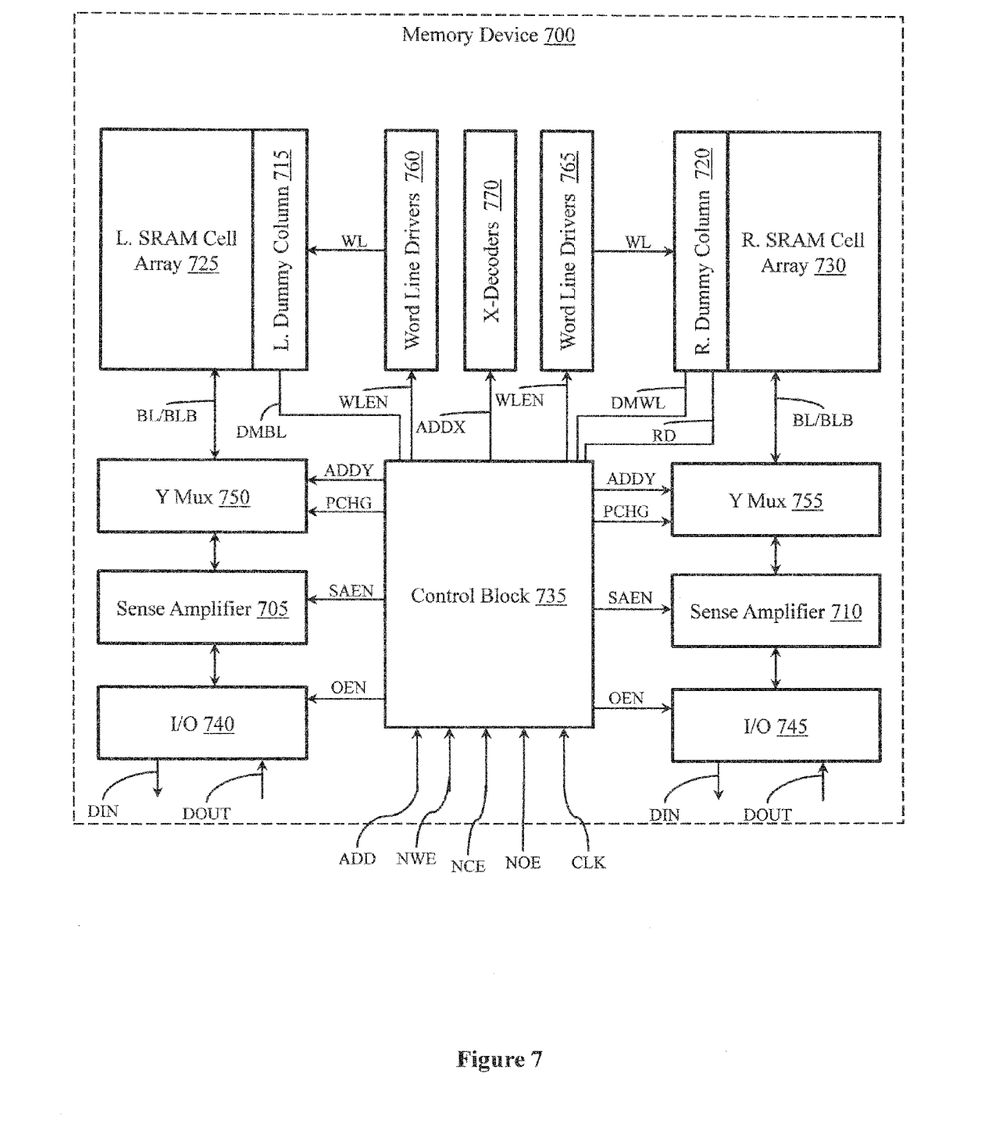
FIG. 7 illustrates one embodiment of a memory device associated with controlling when a sense amplifier is enabled in a memory device.

With reference to FIG. 7, one embodiment of a memory device 700 associated with controlling when a sense amplifier (i.e., sense amplifiers 705 and 710) is enabled is illustrated. In one embodiment, the memory device 700 is a static random access memory (SRAM) that includes two columns of dummy memory cells, a left dummy column 715 and a right dummy column 720. The left and right dummy columns 715 and 720 are part of a left SRAM cell array 725 and a right SRAM cell array 730, respectively. The left and right dummy columns 715 and 720 include SRAM memory cells that have been modified into dummy memory cells. In one embodiment, each of the dummy memory cells includes an inverse bit line that is hardwired to a voltage source. Accordingly, the same value is provided whenever reading from the dummy memory cells. In this way, the dummy memory cells can be used to adjust timing of a sense enable signal when a corresponding word line for a dummy memory cell is selected.

For example, consider that timing variation exists between different SRAM memory cells in the left and right arrays 725 and 730. The timing variation is a difference in time between an expected time for a memory cell to provide a threshold voltage on a bit line and an actual amount of time for the memory cell to provide the threshold voltage on the bit line. The timing variation is caused by, for example, manufacturing variations between the memory cells. Accordingly, the dummy memory cells are used to adjust timing of a sense enable signal to prevent the sense amplifier (e.g., sense amplifier 705 or 710) from being activated prior to the bit line (e.g., BL/BLB) reaching the threshold voltage or from being activated after the bit line has been at the threshold voltage for an extended period of time.

To avoid these timing difficulties, the memory device 700 selects a dummy memory cell with similar timing variation to a memory cell that is being read. Since memory cells that are more proximate to each other are more likely to have a similar timing variation, the memory device 700 uses a dummy memory cell from a corresponding row as the memory cell that is being read.

In addition to using a dummy memory cell to adjust timing of the sense enable signal, a control block 735 includes a set of parallel semiconductor gates that are used to incrementally adjust timing variation detected from the dummy memory cell. Each enabled gate in the set of parallel semiconductor gates advances when the sense enable signal is generated. Accordingly, the control block 735 is configured to selectively enable semiconductor gates in the set of semiconductor gates to modify/control when the sense enable signal is generated and thus when a sense amplifier (e.g., sense amplifier 705 or 710) is activated.

Continuing with FIG. 7, additional elements not yet discussed are, in general, control elements for selecting columns and rows in the left and right SRAM cell arrays 725 and 730. For example, the control block 735 includes control lines ADD, NWE, NCE, NOE, and CLK for receiving control signals from, for example, a host computing device in which the memory device 700 is embedded. FIG. 7 illustrates input/output blocks 740 and 745 with data in (DIN) and data out (DOUT) lines for receiving and providing data to the host computing system.

The control block 735 controls various other elements of the memory device 700 using control lines including output enable (OEN), sense amplifier enable (SAEN), pre-charge (PCHG), ADDY, dummy bit line (DMBL), word line enable (WLEN), ADDX, dummy word line (DMWL), read (RD), and so on.

The memory device 700 also includes a Y MUX 750 and a Y MUX 755. The Y MUXs 750 and 755 are column select logic for selecting different columns in the SRAM cell arrays 725 and 730, respectively. The memory device 700 also includes word line drivers 760 and 765, along with an X-Decoder block 770 for selecting various rows from the SRAM cell arrays 725 and 730. The word line drivers 760 and 765 are connected to the SRAM cells 725 and 730 via word lines (WL).

Figure 8:
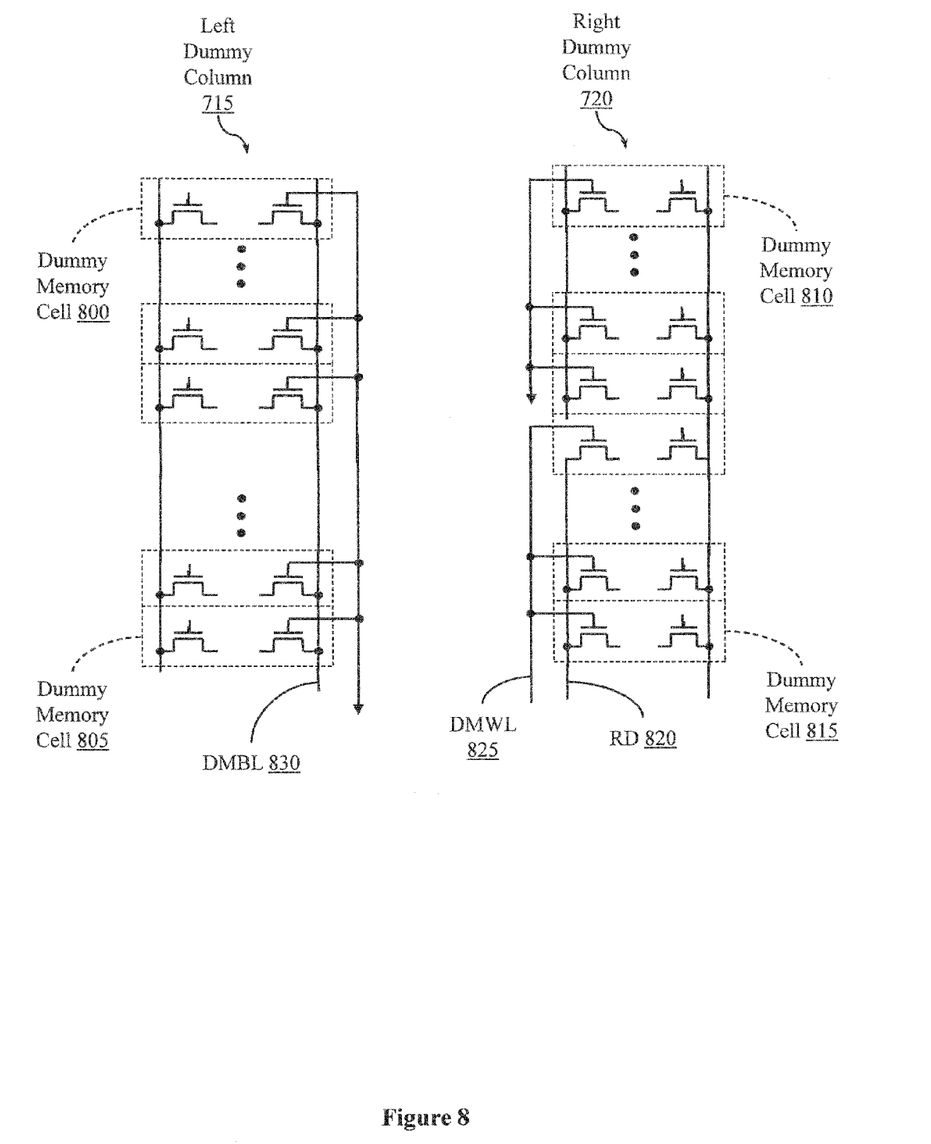
FIG. 8 illustrates example left and right columns of dummy memory cells.

With reference to FIG. 8, embodiment of the left and right dummy columns 715 and 720 from FIG. 7 are illustrated. The left dummy column 715 illustrates dummy memory cells 800 to 805 and the right dummy column illustrates dummy memory cells 810 to 815. For purposes of brevity, dummy memory cells (e.g., 800, 805, 810, and 820) are indicated by a dashed box and not all dummy memory cells in each column are shown. Additionally, only activation gates (e.g., gates 245 and 250 as shown in FIG. 2) for the dummy memory cells (e.g., 800, 805, 810, and 820) are illustrated with additional components not shown. FIG. 8 also illustrates control and data lines. For example, the left dummy column 715 is illustrated with a dummy bit line 830 and the right dummy column 720 is illustrated with a read line 820 (RD) and a dummy word line 825 (DMWL).

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Logic", as used herein, includes but is not limited to hardware, firmware, a non-transitory computer-readable medium that stores instructions, and/or combinations of each to perform a function(s) or an action(s), and/or to cause a function or action from another logic, method, and/or system. Logic may include a microprocessor programmed to perform one or more of the disclosed functions/methods, a discrete logic (e.g., ASIC), an analog circuit, a digital circuit, a programmed logic device, a memory device containing instructions, and so on. Logic may include one or more gates, combinations of gates, or other circuit components. Where multiple logics are described, it may be possible to incorporate the multiple logics into one physical logic. Similarly, where a single logic is described, it may be possible to distribute that single logic between multiple physical logics. One or more of the components and functions described herein may be implemented using one or more of the logic elements.

While for purposes of simplicity of explanation, illustrated methodologies are shown and described as a series of blocks. The methodologies are not limited by the order of the blocks as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional, not illustrated blocks.

To the extent that the term "includes" or "including" is employed in the detailed description or the claims, it is intended to be inclusive in a manner similar to the term "comprising" as that term is interpreted when employed as a transitional word in a claim.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this application is intended to embrace alterations, modifications, and variations that fall within the scope of the appended claims.

What is claimed is:

1. An apparatus, comprising:
   a signal generator configured to generate a sense enable signal that activates a sense amplifier of a memory cell in a memory device;
   a dummy memory cell connected to a current mirror circuit that is configured to detect a timing variation in the dummy memory cell from a predefined timing and to alter a timing of the sense enable signal based, at least in part, on the timing variation; and
   a controller configured to modify the timing of the sense enable signal by selectively enabling one or more of a plurality of semiconductor gates in the current mirror circuit, where the plurality of semiconductor gates are connected in parallel.

2. The apparatus of claim 1, wherein the memory device is a static random access memory (SRAM) and the apparatus is integrated with the SRAM, and wherein the dummy memory cell provides a signal on a dummy bit line through the mirror circuit to the signal generator to alter the timing.

3. The apparatus of claim 1, wherein the controller is configured to modify the timing of the sense enable signal to advance when the sense enable signal occurs.

4. The apparatus of claim 3, wherein the controller is configured to advance when the sense enable signal occurs by an amount based on a number of the plurality of semiconductor gates that the controller enables, and wherein each semiconductor gate enabled by the controller advances the timing of the sense enable signal by a predetermined amount.

5. The apparatus of claim 1, wherein the timing variation is a difference between when the dummy memory cell produces a voltage that satisfies a threshold voltage for reading from the dummy memory cell and the predefined timing of when the dummy memory cell is expected to produce the voltage.

6. The apparatus of claim 5, wherein the threshold voltage is a minimum voltage for activating a logic gate.

7. The apparatus of claim 1, wherein the dummy memory cell includes a bit line connected to a voltage source.

8. A method, comprising:
   detecting a timing variation from a predefined timing in a dummy memory cell that is a static random access (SRAM) memory cell with a connection that causes the SRAM to provide a same voltage value when activated;
   adjusting a timing of a sense enable signal based, at least in part, on the timing variation;
   selectively enabling one or more parallel semiconductor gates to modify the timing of the sense enable signal; and
   generating, in a signal generator, the sense enable signal based, at least in part, on the timing, wherein the sense enable signal activates a sense amplifier in a memory device.

9. The method of claim 8, wherein enabling the one or more parallel semiconductor gates advances when the signal generator generates the sense enable signal.

10. The method of claim 9, wherein enabling the one or more parallel semiconductor gates advances when the sense enable signal activates the sense amplifier by an amount based on a number of the plurality of parallel semiconductor gates that are enabled by a control signal from a controller.

11. The method of claim 8, wherein for each of the plurality of semiconductor gates that are enabled the timing of the sense enable signal is advanced by a predetermined amount.

12. The method of claim 8, wherein the timing variation is a difference between when the dummy memory cell produces a voltage that satisfies a threshold voltage for reading from the dummy memory cell and the predefined timing of when the dummy memory cell is expected to produce the voltage.

13. The method of claim 12, wherein the threshold voltage is a minimum voltage for activating a logic gate.

14. The method of claim 8, wherein generating the sense enable signal causes the sense amplifier to read a value from the memory cell.

15. The method of claim 8, wherein detecting the timing variation in a dummy memory cell includes reading a bit line of the dummy memory cell that is hardwired to a voltage source.

16. An integrated circuit, comprising:
   a signal generator configured to produce a sense enable signal that activates a sense amplifier; and
   a dummy memory cell connected to a current mirror circuit, wherein the current mirror circuit is configured to detect a timing variation in the dummy memory cell from a predefined timing and to alter a timing of the sense enable signal based, at least in part, on the timing variation; and
   a controller configured to modify the timing of the sense enable signal by selectively enabling one or more of a plurality of semiconductor gates in the current mirror circuit that are connected in parallel.

17. The integrated circuit of claim 16, wherein the current mirror circuit includes a plurality of semiconductor gates connected in parallel and configured to change a rate at which voltage is provided by the dummy memory cell based on a number of the semiconductor gates that are enabled.

18. The integrated circuit of claim 16, wherein the sense enable circuit is configured to activate the sense amplifier to read data from a memory cell in a memory device.

19. The integrated circuit of claim 16, wherein the integrated circuit is a static random access memory (SRAM).

\* \* \* \* \*